United States Patent
Ohguro et al.

(10) Patent No.: US 6,459,134 B2
(45) Date of Patent: Oct. 1, 2002

(54) SEMICONDUCTOR DEVICES WHICH HAVE ANALOG AND DIGITAL CIRCUITS INTEGRATED ON A COMMON SUBSTRATE

(75) Inventors: Tatsuya Ohguro, Yokohama; Yoshiaki Toyoshima, Kashiwa, both of (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/818,041

(22) Filed: Mar. 27, 2001

(30) Foreign Application Priority Data

Mar. 27, 2000 (JP) ........................ 2000-087687
Mar. 15, 2001 (JP) ........................ 2001-074789

(51) Int. Cl.$^7$ ............................................ H01L 29/00
(52) U.S. Cl. .................. 257/501; 257/501; 257/506; 257/503; 257/523; 257/544; 257/565
(58) Field of Search ................ 257/355–363, 257/376, 392, 500, 501, 503, 506, 544, 546, 547, 548

(56) References Cited

U.S. PATENT DOCUMENTS 5,900,763 A * 5/1999 Rahim et al. ............... 327/292
5,994,741 A 11/1999 Koizumi
6,057,588 A1 5/2001 Yamazaki

FOREIGN PATENT DOCUMENTS

| EP | 10-12717 | 1/1998 |
|----|----------|--------|
| JP | 3-222455 | 10/1991 |
| JP | 2000-31381 | 1/2000 |

* cited by examiner

*Primary Examiner*—Kamand Cuneo
*Assistant Examiner*—David A. Zarneke
(74) *Attorney, Agent, or Firm*—Pillsbury Winthrop LLP

(57) ABSTRACT

A semiconductor device with digital and analog circuits has a structure for preventing noise penetration from the digital circuit to the analog circuit. The semiconductor device has a semiconductor substrate, first and second wells independently formed at a surface of the semiconductor substrate, the digital circuit formed at a surface of the first well, and the analog circuit formed at a surface of the second well. The specific resistance of the semiconductor substrate is at least 1000 times as large as the specific resistance of the first well. A conductive guard-ring may be formed in the surface of an area that is between the digital circuit and the second well or between the first well and the second well.

14 Claims, 11 Drawing Sheets

SEMICONDUCTOR DEVICES WHICH HAVE ANALOG AND DIGITAL CIRCUITS INTEGRATED ON A COMMON SUBSTRATE

CROSS REFERENCE TO RELATED APPLICATIONS

This application claims benefits of priority under 35 USC 119 to Japanese Patent Applications No. 2000-087687 filed on Mar. 27, 2000 and No. 2001-0074789 filed on Mar. 15, 2001, the entire contents of which are incorporated by reference herein.

BACKGROUND OF THE INVENTION

1. Field of the Invention

The present invention relates to a semiconductor device with analog and digital circuits and a method of manufacturing thereof.

2. Description of the Related Art

Increasing use of portable terminals requires light, compact, low-cost semiconductor devices. To meet their requests, semiconductor devices which have analog and digital circuits on a single chip are being developed, to replace those which had previously been mounted on separate chips.

Placing analog and digital circuits on a single chip has problem that noise produced by the digital circuit enters the analog circuit through a substrate and wells, which is causing interference with the proper operation of the analog circuit.

FIGS. 10A to 10C are sectional views roughly showing semiconductor device structures each having analog and digital circuits according to prior arts. FIGS. 9A to 9C are graphs showing simulated noise penetration levels to analog circuits from digital circuits according to the prior arts. In each graph, an abscissa represents noise frequencies produced by a digital circuit and an ordinate represents noise levels entering an analog circuit.

In FIG. 10A, the semiconductor device has a p-type substrate 510 in which an n-well 520 is formed. A digital circuit 530 and an analog circuit 540 are formed in the same n-well 520. This structure is a "common well structure." Between the digital circuit 530 and the analog circuit 540, a guard-ring 550 is added.

The guard-ring is a high-concentration impurity diffused region to absorb noise leaking from a digital circuit, and in this example, is arranged between the digital circuit 530 and the analog circuit 540. The guard-ring may be a wall or a ring surrounding a digital circuit.

In FIG. 11A, the common well structure without noise preventive measures passes large noise from the digital circuit 530 to the analog circuit 540 irrespective of noise frequencies. If the guard-ring 550 is added, a slight improvement is observed but noise entering the analog circuit 540 is still large.

The semiconductor device of FIG. 10B has a p-type semiconductor substrate 512 in which n-wells 522 and 562 are separately formed. A digital circuit 532 is formed in the n-well 522, and an analog circuit 542 is formed in the n-well 562. More precisely, the analog circuit 542 is formed in a p-well 572 that is formed in the n-well 562. In the analog circuit formed area, the p-type substrate 512, n-well 562, and p-well 572 form a triple structure. This is a "triple well structure." A guard-ring 552 is formed, if needed, in the n-well 522 between the digital circuit 532 and the analog circuit 542.

The semiconductor substrate 512 is usually a low resistance substrate having a specific resistance of, for example, 1 Ω cm because such a substrate is easy to make and handle.

In FIG. 11B, the triple well structure without a guard-ring realizes a noise level of lower than −60 dB for noise frequencies lower than 100 M ($10^8$) Hz. If the guard-ring 552 is added, the triple well structure further suppresses noise penetration. For noise frequencies over 1 G ($10^9$) Hz, however, the triple well structure with or without the guard-ring 552 is ineffective and passes unignorable noise.

The semiconductor device of FIG. 10C has an SOI substrate. The SOI substrate has an oxide layer 516 sandwiched between an upper semiconductor layer and a lower semiconductor layer 514. The upper semiconductor layer has n-wells 524 and 564 and a p-type semiconductor region 574 between the n-wells 524 and 564. In the n-well 524, a digital circuit 534 is formed, and in the n-well 564, an analog circuit 544 is formed.

In FIG. 11C, the SOI substrate structure with a guard-ring 554 shows a remarkable effect of absorbing noise, to prevent the penetration of noise to the analog circuit 544.

Noise paths to the analog circuit 542 in the triple well structure of FIG. 10B will be explained. Some noise emanates from the side of the digital circuit 532, passes through the surface of the n-well 522, and enters the analog circuit 542. Some noise emanates from the bottom of the digital circuit 532, passes through the semiconductor substrate 512 under the digital circuit 532, and reaches the analog circuit 542. The guard-ring 552 effectively absorbs the sideward noise but is useless to absorb the bottom passing noise. On the other hand, the SOI substrate structure of FIG. 10C has the $SiO_2$ layer 516 under the n-well 524 to block the bottom noise from the digital circuit 534. As a result, a major noise path to the analog circuit 544 laterally extends through the surfaces of the wells. As a result, the guard-ring 554 is effective to absorb the laterally passing noise.

In this way, the combination of an SOI substrate and a guard-ring is most effective so far among the conventional structures to prevent noise penetration from a digital circuit to an analog circuit. Still, there is a need for a structure that is capable of preventing the penetration of high-frequency noise to an analog circuit.

The conventional SOI substrate structure has some problems. For example, SOI substrates are expensive compared with standard semiconductor substrates. Further, the SOI substrate involves low heat conductivity at the intermediate oxide layer 516, and therefore, is unable to effectively radiate heat during the operation of elements. In addition, the SOI substrate is structurally unable to release hot carriers if produced, thereby destabilizing transistor properties.

SUMMARY OF THE INVENTION

An object of the present invention is to provide a semiconductor device with digital and analog circuits, having a new structure employing an SOI substrate or a substrate comparable to an SOI substrate, as well as a method of manufacturing such a semiconductor device.

In order to accomplish the objects, a first aspect of the present invention provides a semiconductor device with digital and analog circuits formed in a high-resistance semiconductor substrate of a first conductivity type. First and second wells of a second conductivity type are independently formed at a surface of the semiconductor substrate. The digital circuit is formed at a surface of the first well, and the analog circuit is formed at a surface of the second well. The specific resistance of the semiconductor substrate is at least 1000 times as large as the specific resistance of the first well.

A second aspect of the present invention provides a semiconductor device with digital and analog circuits formed in a substrate having an upper semiconductor layer, a lower semiconductor layer, and an insulating layer sandwiched between the upper and lower semiconductor layers. First and second wells of a second conductivity type independently are formed in the upper semiconductor layer with a semiconductor region of a first conductivity type being interposed between the first and second wells. The digital circuit is formed at a surface of the first well, the analog circuit is formed at a surface of the second well, and a conductive guard-ring is formed in a surface of an area that is between the digital circuit and the second well or between the first well and the second well. A distance between a bottom of the guard-ring and a bottom of the first well is 0.8 $\mu$m or shorter.

DETAILED DESCRIPTION OF THE EMBODIMENTS

Various embodiments of the present invention will be described with reference to the accompanying drawings.

(First embodiment)

A semiconductor device according to the first embodiment of the present invention basically has a conventional triple well structure. What is characteristic to the first embodiment is the use of a high-resistance substrate.

The aspect provides the semiconductor substrate with a sufficiently high resistance so that the semiconductor substrate around a first well may prevent noise generated by the digital circuit in the first well from penetrating the analog circuit in a second well.

The high-resistance substrates may form the semiconductor substrate according to any one of MCZ, CZ, and FZ methods. The semiconductor substrate may have a solid solution oxygen quantity of $1 \times 10^{18}$ atoms/cm$^3$ or below.

The first aspect may separate the first and second wells by a distance (w) of 0.5 $\mu$m or longer.

As the distance between the first and second wells extends, resistance between the wells increases to effectively prevent noise penetration to the analog circuit. If the distance between the wells is 0.5 $\mu$m or longer, the noise preventive effect will be appropriate.

The aspect may form a third well of the first conductivity type at the surface of the second well and may form the analog circuit in the third well. In this case, in addition to the noise preventive effect of the high-resistance semiconductor substrate, another noise preventive effect is provided by PN-junction resistance between the second and third wells.

The semiconductor device of the first embodiment will be explained in detail.

Figure 1A:
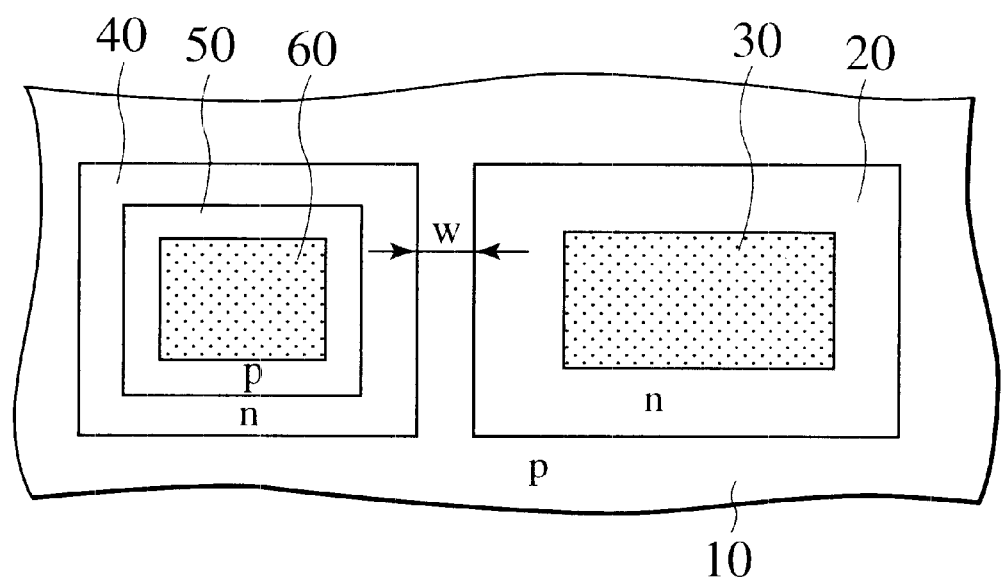
FIG. 1A is a plan view showing a semiconductor device employing a high-resistance substrate according to a first embodiment of the present invention.
Figure 1B:
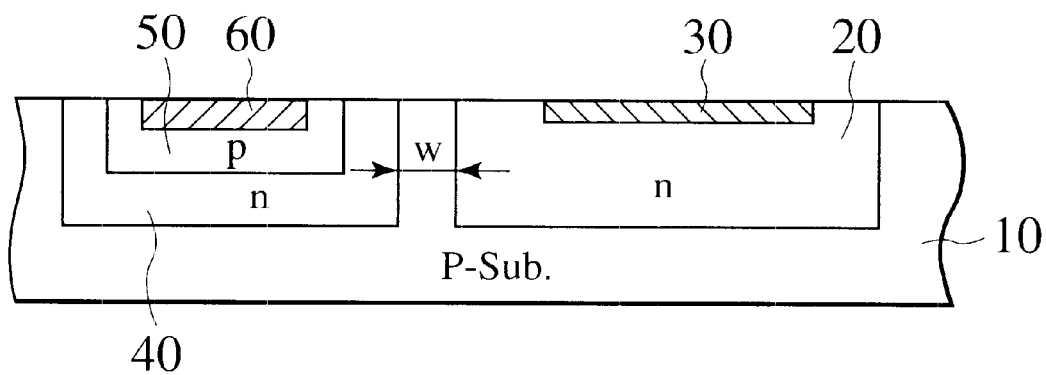
FIG. 1B is a sectional view showing the semiconductor device of the first embodiment.

FIG. 1A is a plan view showing the semiconductor device with digital and analog circuits according to the first embodiment, and FIG. 1B is a sectional view showing the same. The semiconductor device has the high-resistance substrate 10 of p-type. The substrate 10 has a digital circuit forming area in which an n-well 20 is formed and an analog circuit forming area in which an n-well 40 is formed. The n-wells 20 and 40 are independent of each other. In the analog circuit forming area, the n-well 40 contains a p-well 50 in which an analog circuit 60 is formed. In the digital circuit forming area, a digital circuit 30 is formed in the n-well 20. Each of the analog circuit 60 and digital circuit 30 has active elements such as MOS transistors and bipolar transistors.

The n-wells 20 and 40 have each a depth of about, for example, 1.5 $\mu$m. The distance w between the n-wells 20 and 40 is about, for example, 0.5 $\mu$m.

The p-well 50 has a specific resistance of, for example, 0.25 $\Omega$ cm, and the n-wells 20 and 40 have each a specific resistance of, for example, 0.065 $\Omega$ cm. The specific resistance of the high-resistance substrate 10 is at least 1000 times as large as any one of these specific resistance values, preferably, the specific resistance of the p-well 50. For example, the specific resistance of the substrate 10 is 250 $\Omega$ cm or greater. This specific resistance value corresponds to a solid solution oxygen quantity of about $8.1 \times 10^{17}$ atoms/cm$^3$ or lower.

Oxygen atoms contained as impurities in a substrate serve as dopants. To increase the resistance of a substrate, a solid solution oxygen quantity in the substrate must be reduced.

Lattice defects caused by oxygen in the substrate, however, properly absorb various stress applied to the substrate during manufacturing processes and improve the mechanical strength of the substrate. Accordingly, it is preferable to maintain the solid solution oxygen quantity of a substrate at a proper value to secure the mechanical strength of the substrate.

A substrate containing a low solid solution oxygen quantity is producible according to CZ (Czochralski) method, FZ (floating zone) method, or MCZ (magnetic field applied CZ) method. The MCZ method applies a magnetic field to a solution, to suppress convection in the solution, thereby suppressing oxygen concentration in crystals.

Unlike the conventional triple well structure that mainly employs PN-junction resistance to prevent noise produced by a digital circuit from entering an analog circuit, the first embodiment utilizes the high resistance of the substrate 10 itself between the n-well 20 and the n-well 40, to prevent noise penetration to the analog circuit 60.

Figure 2A:
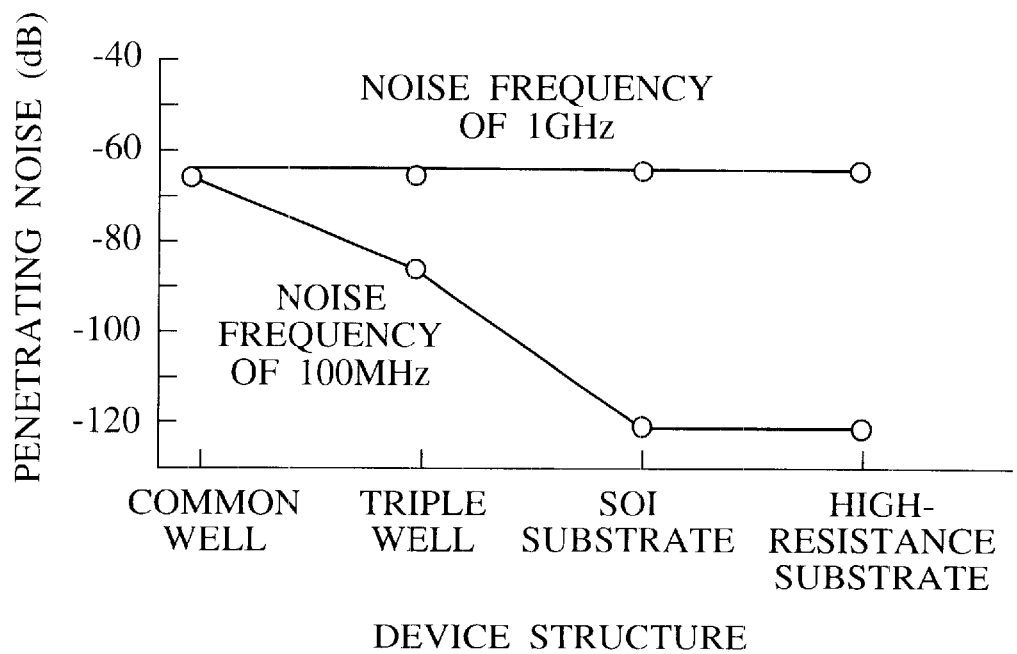
FIG. 2A is a graph showing a comparison of analog circuit noise levels of the first embodiment with those of a prior art.

FIG. 2A is a graph showing a comparison of simulated penetrating noise levels of the first embodiment employing the triple well structure involving the high-resistance substrate with those of the conventional structure.

For a noise frequency of 1 GHz, the first embodiment shows no effect of reducing penetrating noise. For a noise frequency of 100 MHz, the first embodiment greatly reduces penetrating noise compared with the conventional common well structure or triple well structure. The noise reduction effect of the first embodiment for 100-MHz noise is comparable to that of the SOI substrate structure.

Figure 2B:
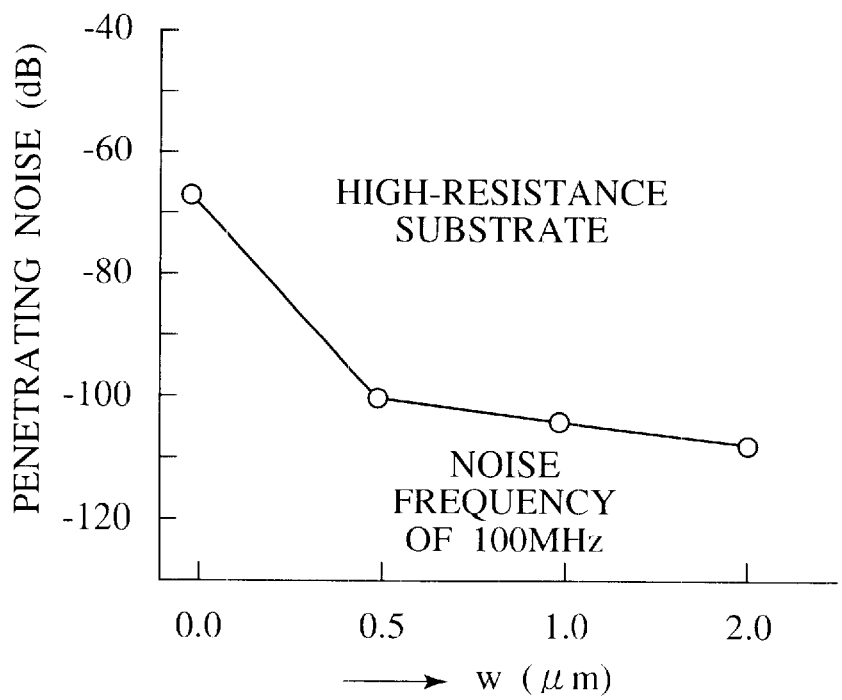
FIG. 2B is a graph showing a relationship between well-to-well distances w and penetrating noise levels, the well-to-well distance being measured between a well in an analog circuit formed area and a well in a digital circuit formed area.

FIG. 2B is a graph showing a simulated relationship between well-to-well distances w and penetrating noise levels. The well-to-well distance w is measured between the n-well 20 in the digital circuit forming area and the n-well 40 in the analog circuit forming area. The noise levels are those generated by the digital circuit 30 and entering the analog circuit 60. As the distance w between the n-wells 20 and 40 extends, resistance between the n-wells increases to improve the noise preventive effect. For a noise frequency of 100 MHz, the distance w must be 0.5 $\mu$m or longer to achieve a preferable penetrating noise level of −100 dB or lower.

Usually, an analog circuit for working at high frequencies contains a thin film inductance element, which has a plane spiral conductive pattern. The spiral conductive pattern causes an eddy current in the semiconductor substrate and the eddy current therefore causes an induced current. If the conventional semiconductor substrate is used, the induced current reduces Q-values of the inductance element.

However, if the semiconductor high-resistance substrate is used, the quantity of the induced current decreases as a result of the high-resistance of the substrate. Therefore the Q-values of the inductance element are prevented from becoming worse.

Figure 3:
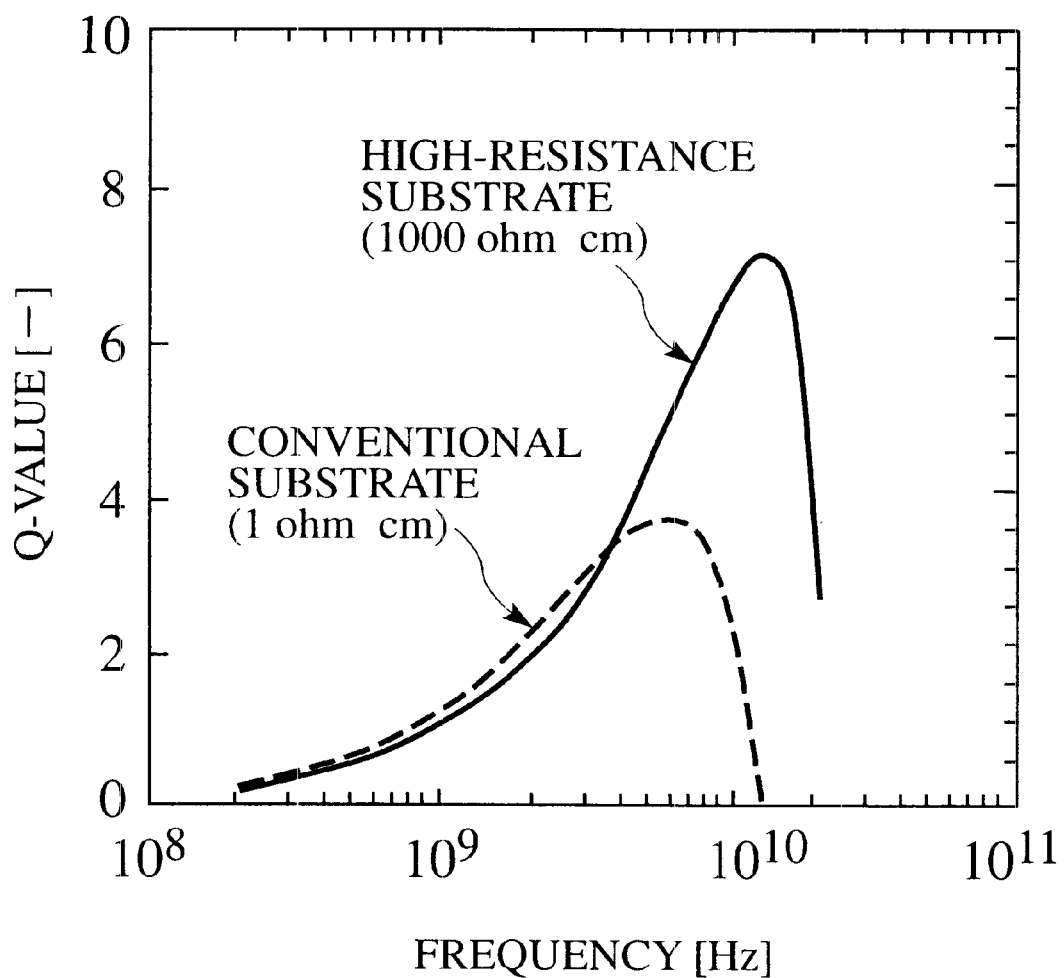
FIG. 3 is a graph showing a relationship between Q-values of inductance elements and frequencies.

FIG. 3 is a graph showing the relationship between frequencies and Q-values of inductance elements. As shown in the graph, especially in high frequency conditions, Q-values of the inductance element formed in the high-resistance substrate of 1000 $\Omega$ cm is much greater than the Q-values of one formed in the conventional substrate of 1 $\Omega$ cm.

In this way, the usage of the high-resistance substrate according to the first embodiments not only prevents noise penetration from digital circuits to analog circuits but also improves the inductance element characteristic in the analog circuits.

Figure 4A:
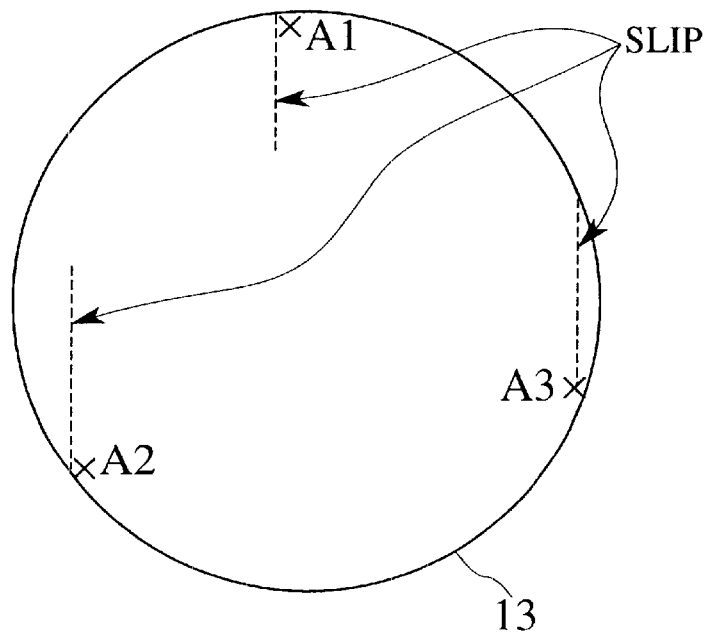
FIG. 4A is a plan view showing slip lines in a high-resistance substrate.

By the way, as the oxide concentration of such a high-resistant substrate is very low, its mechanical strength is weaker than the conventional one. For example, during the semiconductor manufacturing process, especially in the annealing high-resistance semiconductor substrates, each substrate is usually supported by a pin holder. The pin holder is attached to the semiconductor substrate surface at three points in around the periphery. Because the mechanical stress or thermal stress is localized at three points during the annealing process, slips generate near the three points A1–A3 as shown in FIG. 4A.

Figure 4B:
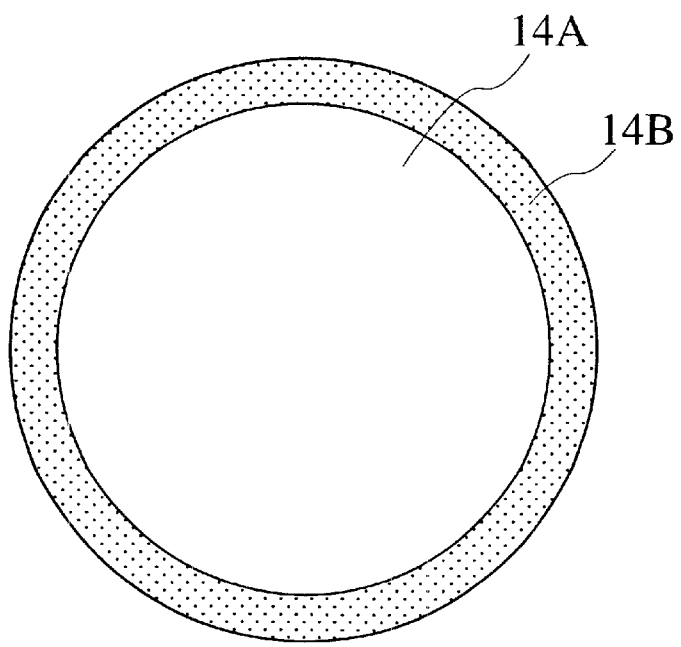
FIG. 4B is a plan view showing a substrate in which a high-resistance inside region and a low-resistance outside region exist.

Accordingly, it is preferable to employ the semiconductor substrate 14 shown in FIG. 4B. The substrate 14 has a low-resistance round area 14B in the periphery and a high-resistance area 14A inside the low-resistance area 14B. The oxide concentration of the peripheral area where stress localizes during the manufacturing process is high enough to obtain sufficient mechanical strength. The substrate structure prevents defects such as slip generation while maintaining the merit of high-resistance substrates.

For example, the width of the low-resistance area 14A may be greater than about 1mm from the edge of the substrate. Also the solid solution oxygen quantity of the low-resistance area 14B may preferably be more than or equal to $1\times10^{18}$ atoms/cm$^3$. The low-resistance area 14B is readily obtained by selective oxide ion implantation.

(Second embodiment)

Semiconductor device according to the second embodiment of the present invention has a deep guard-ring in the structure of the first embodiment or SOI structure.

The deep guard-ring is formed in the surface of the substrate between the digital circuit and the second well in an area that is inside the first well or between the first well and second well.

In the structure with the high-resistance semiconductor substrate, sideward noise from the first well to the analog circuit in the second well is more critical than downward noise from the first well to the analog circuit passing through a lower part of the high-resistance substrate. The guard-ring in a sideward noise path effectively absorbs the sideward noise, to prevent noise penetration to the analog circuit.

The aspect may set a distance (t) between the bottom of the guard-ring and the bottom of the first well to 0.8 $\mu$m or shorter. Deepening the guard-ring, i.e., shortening the distance between the bottom of the guard-ring and the bottom of the first well results in widely catching the sideward noise from the first well, to effectively prevent noise penetration to the analog circuit.

The deep guard-ring is effective for SOI substrate structure. The insulating layer of the SOI substrate is under the first and second wells, so that noise produced by the digital circuit hardly passes under the wells to the analog circuit. As a result, a path of leakage noise mainly runs sideward, which is effectively blocked by the guard-ring formed in the noise path. Unlike the prior art that employs a shallow guard-ring, the second aspect sufficiently deepens the guard-ring to widely absorb leakage noise, thereby effectively preventing noise penetration to the analog circuit.

The semiconductor device of the second embodiment will be explained in detail.

Figure 5A:
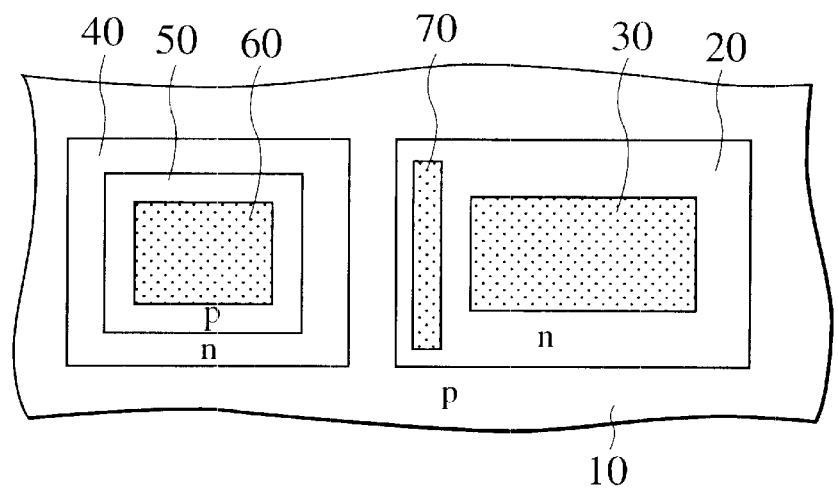
FIG. 5A is a plan view showing a semiconductor device with a guard-ring according to a second embodiment of the present invention.
Figure 5B:
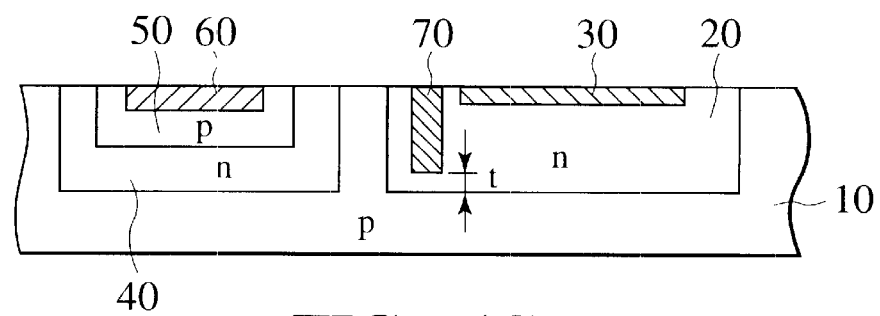
FIG. 5B is a sectional view showing the semiconductor device of the second embodiment.
Figure 5C:
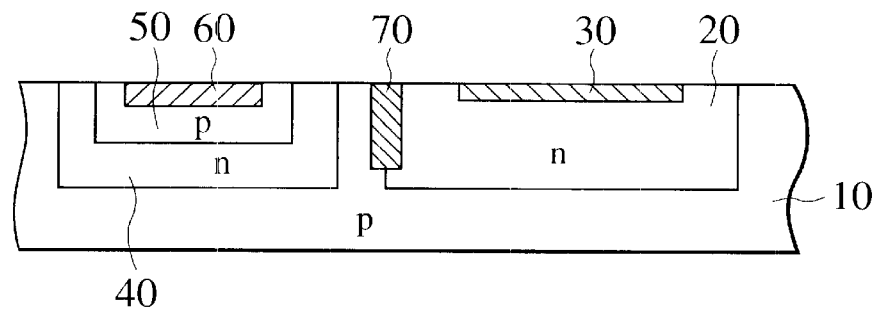
FIG. 5C is a sectional view showing a modification of the second embodiment.
Figure 5D:
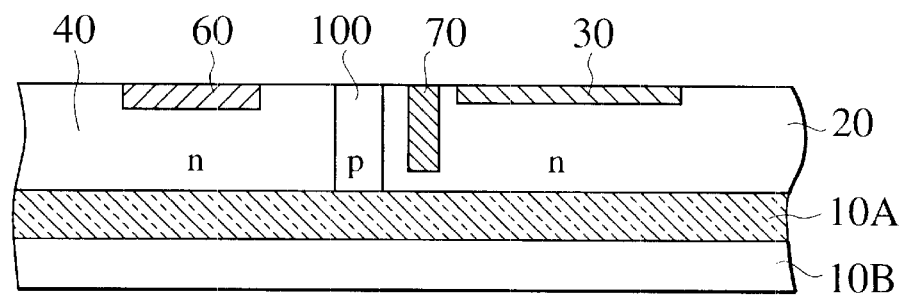
FIG. 5D is a sectional view showing a semiconductor device having an SOI substrate structure with a guard-ring.

FIG. 5A is a plan view showing a semiconductor device according to the second embodiment of the present invention, FIGS. 5B–5D are sectional views showing the semiconductor device in the same embodiment.

The semiconductor device of the second embodiment is provided with a guard-ring in addition to the structure of the first embodiment. Namely, the conductive guard-ring 70 is formed beside a digital circuit 30, which is formed in an n-well 20. The guard-ring 70 blocks a noise path to an analog circuit 60.

Unlike the conventional guard-ring that is formed during the formation of source and drain regions to a depth of about 0.2 µm equal to the depth of the source and drain regions, the second embodiment forms the guard-ring deeper than the conventional one.

The guard-ring 70 of the second embodiment absorbs noise generated by the digital circuit 30, thereby preventing the noise from entering the analog circuit 60. The guard-ring 70 is not necessarily a ring surrounding the digital circuit 30. The guard-ring 70 may be a wall extending between the digital and analog circuits.

Figure 6:
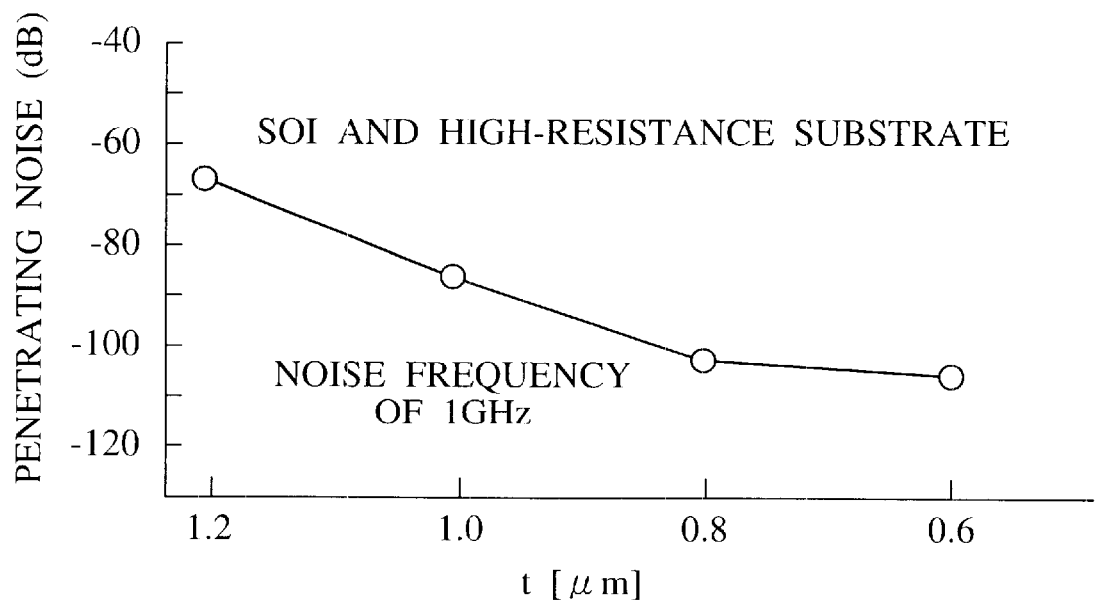
FIG. 6 is a graph showing a relationship between bottom-to-bottom distances t and penetrating noise levels, the bottom-to-bottom distance being measured between the bottom of a well and the bottom of a guard-ring formed according to the second embodiment.

FIG. 6 is a graph showing simulated noise levels penetrating to the analog circuit 60 with respect to various distances t between the bottom of the guard-ring 70 and the bottom of the n-well 20. Compared with the first embodiment without a guard-ring, the second embodiment additionally provides the effect of reducing high-frequency noise of 1 GHz if the distance t is shorter than 1.2 µm. In particular, the distance t of 0.8 µm or shorter reduces the penetrating noise below −100 dB.

FIG. 5D is showing a SOI substrate structure with a same guard-ring.

FIG. 6 also shows penetrating noise levels simulated for an SOI substrate structure with a guard-ring. The SOI substrate structure with a deep guard-ring is shown in FIG. 5D. In this case, the distance t is measured between the bottom of the guard-ring and the bottom of a well, i.e., the surface of an intermediate insulating layer formed in the SOI substrate. The simulated noise levels for the SOI substrate structure are equal to the above embodiment that employs the triple well structure, high-resistance substrate, and guard-ring.

When the resistance of a semiconductor substrate is high like that of an SOI substrate, noise generated by a digital circuit mainly flows through low-resistance wells at the surface of the substrate instead of the high-resistance substrate, and therefore, much of the noise flowing at the surface of the substrate is caught by the guard-ring. Namely, the noise absorbing effect of the guard-ring effectively functions.

The high-resistance substrate and SOI substrate each with a deep guard-ring are capable of greatly reducing noise penetration to an analog area. A guard-ring having a sufficient depth is capable of widely catching noise generated by a digital circuit, including noise that may pass under a conventional shallow guard-ring to an analog region. Compared with the conventional guard-ring of about 0.2 µm deep, the guard-ring 70 of the second embodiment has a depth of about, for example, 0.7 µm. Since the depth of the n-well is 1.5 µm in this case, the depth of the guard-ring may be longer than or equal to about seven-fifteenth of the n-well depth.

The guard-ring 70 may be formed in the n-well 20 as shown in FIG. 3B. Instead, it may partly be outside the n-well 20 as shown in FIG. 3C. As long as the guard-ring 70 is separated from the n-well 40 where the analog circuit is formed, the guard-ring 70 can be formed anywhere between the n-well 20 and the n-well 40.

Figure 7:
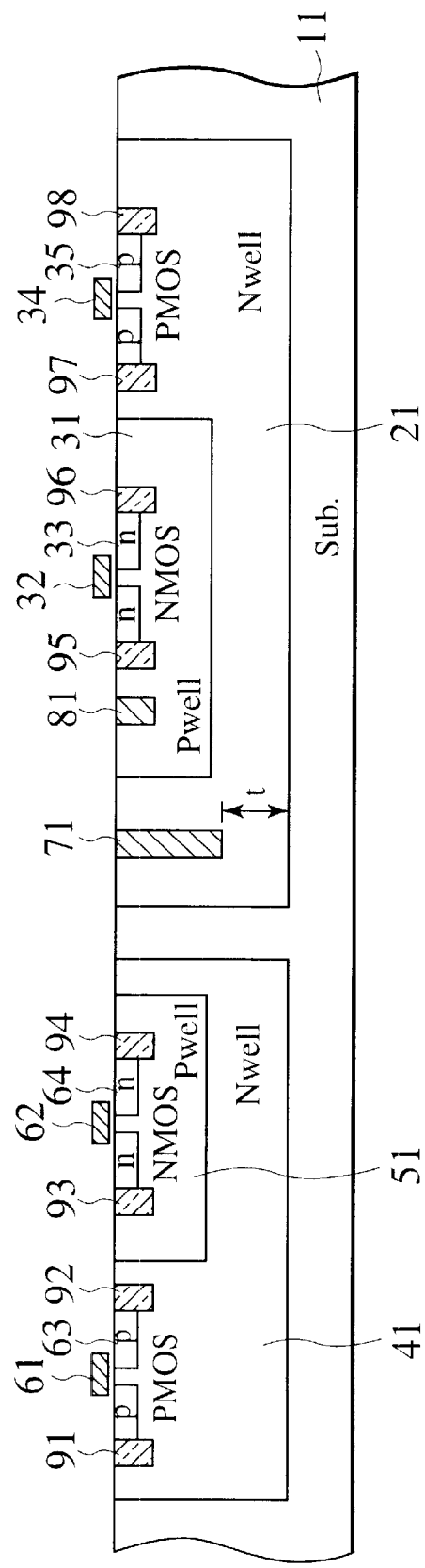
FIG. 7 is a sectional view showing a semiconductor device having CMOS circuits based on the first and second embodiments.

FIG. 7 is a sectional view showing an example of a semiconductor device having CMOS circuits that employ the structures of the first and second embodiments. The semiconductor device has analog and digital circuit forming areas each having CMOS transistors. The digital circuit forming area is in a high-resistance substrate 11 and has an n-well 21, which contains a p-well 31. An NMOS transistor is formed at the surface of the p-well 31. The NMOS transistor consists of n-type source and drain regions 33, a gate oxide film formed on the source and drain regions, and a gate electrode 32 formed on the gate oxide film. A PMOS transistor is formed at the surface of the n-well 21 outside the p-well 31. The PMOS transistor consists of p-type source and drain regions 35, a gate oxide film formed on the source and drain regions, and a gate electrode 34 formed on the gate oxide film.

The analog circuit forming area is in the high-resistance substrate 11 and has an n-well 41, which contains a p-well 51. A PMOS transistor is formed at the surface of the n-well 41. The PMOS transistor consists of p-type source and drain regions 63, a gate oxide film formed on the source and drain regions, and a gate electrode 61 formed on the gate oxide film. An NMOS transistor is formed at the surface of the p-well 51. The NMOS transistor consists of n-type source and drain regions 64, a gate oxide film formed on the source and drain regions, and a gate electrode 62 formed on the gate oxide film.

Each of the transistor forming areas is isolated by LOCOS or element isolation oxide films 91 to 98.

A guard-ring 71 is formed in the n-well 21 in the vicinity of the analog circuit forming area. In addition, a guard-ring 81 is formed in the p-well 31 beside the NMOS transistor. In this way, the number of guard-rings is not limited to one but may be two or more.

The n-wells 21 and 41 have each a depth of, for example, 2.1 µm, and the p-wells 31 and 51 have each a depth of, for example, 1.5 µm. In this case, the distance between the bottom of each well and the bottom of each guard-ring is 0.8 µm or shorter. Namely, the depth of the guard-ring 71 is about 1.3 µm or deeper, and the depth of the guard-ring 81 is about 0.7 µm or deeper.

(Third embodiment)

The third embodiment of the present invention relates to guard-ring structures and a method of manufacturing a guard-ring.

The guard-ring in the third embodiment comprises a trench, an oxide layer covering an inner wall of the trench, and a metal layer filling the trench. The oxide layer on the inner wall of the trench prevents heat diffusion from the metal filled in the trench to the periphery of the trench.

As mentioned in the second embodiment, noise generated by a digital circuit will effectively be blocked by a guard-ring that is deeper than conventional ones. A conventional method forms a guard-ring simultaneously with transistor source and drain regions by ion implantation, and therefore, is unable to form a deep guard-ring. This is because the conventional method equalizes the depth of a guard-ring to the depth of source and drain regions.

Figure 8A:
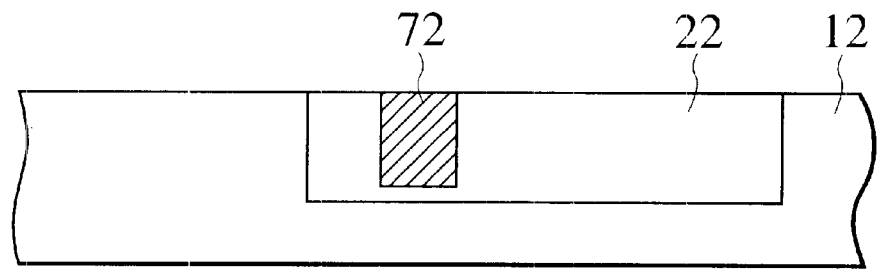
FIGS. 8A to 8C are sectional views showing various guard-ring structures according to a third embodiment of the present invention.
Figure 8B:
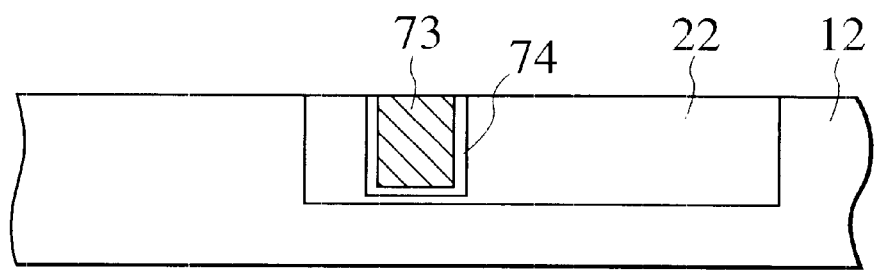
Figure 8C:
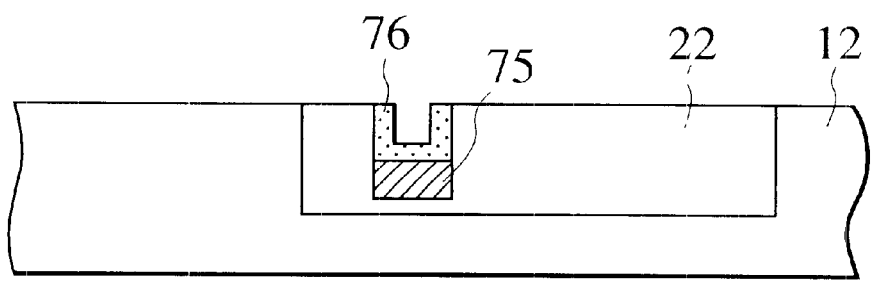

FIGS. 8A to 8C are sectional views showing guard-ring structures in semiconductor substrates according to the third embodiment. Each Fig. specifically shows a digital circuit forming area in a high-resistance substrate 12. An n-well 22 is formed in the digital circuit forming area, and a guard-ring is formed in the n-well 22.

The guard-ring 72 of FIG. 8A is formed by high-concentration ion implantation. Separately from an ion implantation process for source and drain regions, p- or n-type impurity ions are implanted at a high acceleration voltage, and implanted ions are activated by thermal annealing. For example, impurity ion implantation to the n-well 22 is carried out with P (phosphorus) ions of the same conductivity type at a dose of $4-10^{15}/cm^2$ under an acceleration voltage of about 90 keV that is double an acceleration voltage used for the formation of source and drain regions.

The guard-ring 73 of FIG. 8B is formed by metal burying. RIE (reactive ion etching) is used to form a trench in the well 22 of the substrate 12, and an inner surface of the trench is oxidized to form an oxide film 74. The trench is filled with metal such as Al, Cu, W, etc. Thereafter, a CMP process is carried out to flatten the surface of the substrate. Even if metal such as Al that easily diffuses to the periphery is employed, the oxide film 74 in the trench prevents the diffusion, to secure transistor operations. If the buried metal hardly diffuses, the oxide film 74 may be omitted.

The guard-ring of FIG. 8C is formed by making a trench in the well 22 of the substrate 12, implanting ions in the bottom of the trench to form an ion implanted region 75, and forming a silicide layer 76 on an inner surface of the trench.

Next, the method of manufacturing the guard-ring shown in FIG. 8C will be explained. The method includes the steps of forming a trench in a substrate and implanting impurity ions into the bottom of the trench to form an ion implanted layer, thereby forming the guard-ring.

With use of the trench, the effective depth of the guard-ring is the depth of the trench plus the depth of the ion implanted layer. The aspect is capable of forming a deep guard-ring under standard ion implanting conditions.

A metal film may be formed on an inner surface of the trench. The metal film is heat-treated to form metal silicide, which provides the guard-ring with low resistance.

The trench forming step may simultaneously be carried out with the step of forming trenches and depositing element isolation oxide films in the trenches. This forms the guard-ring trench without increasing the number of processes.

The manufacturing process will be explained.

Figure 9A:
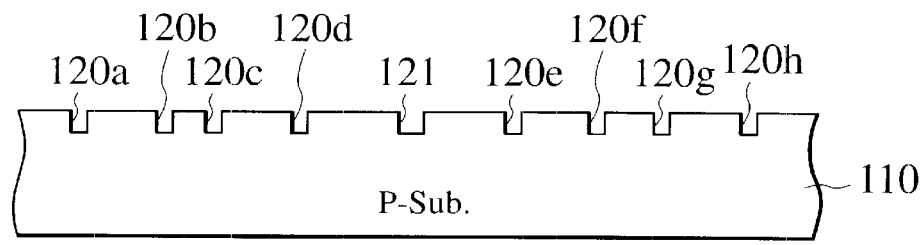
FIGS. 9A to 9E show the steps of manufacturing a guard-ring of the third embodiment during the formation of element isolation regions.

FIGS. 9A to 9E show the steps of manufacturing the guard-ring of FIG. 8C during the step of forming a buried oxide film for element isolation regions. In FIG. 9A, trenches 120 for element isolation regions and a trench 121 for a guard-ring are formed in a p-type high-resistance substrate 110 by, for example, RIE. Each trench has a depth of, for example, 0.3 to 0.4 $\mu$m.

Figure 9B:
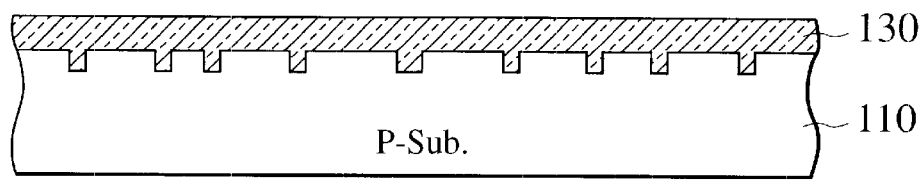
Figure 9C:
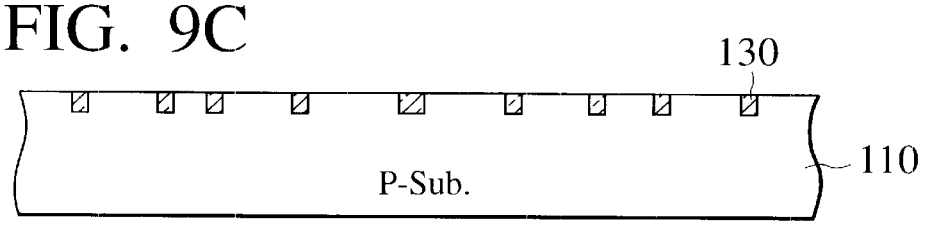

In FIG. 9B, a $SiO_2$ film 130 is formed on the substrate 110 to bury the trenches. In FIG. 9C, the surface of the substrate is flattened by CMP.

Figure 9D:
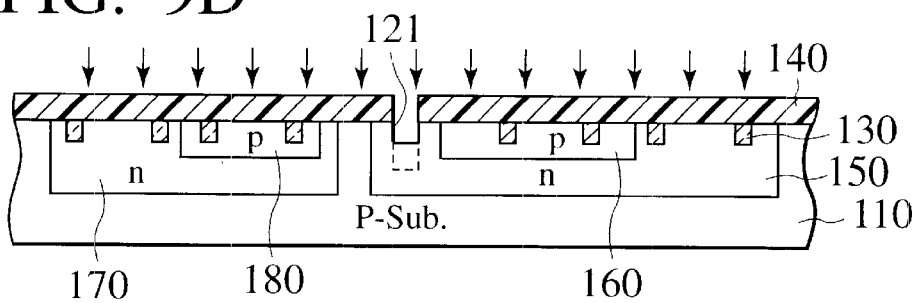
Figure 9E:
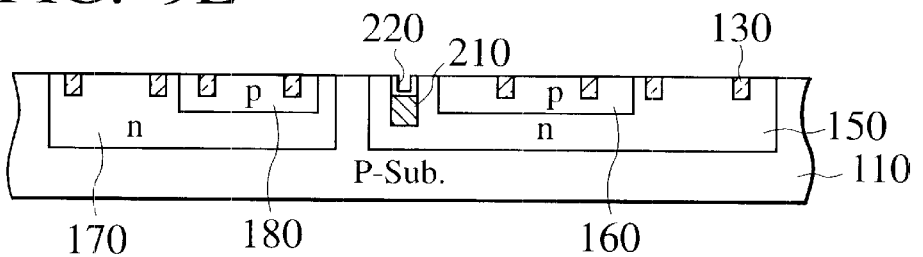
Figure 10A:
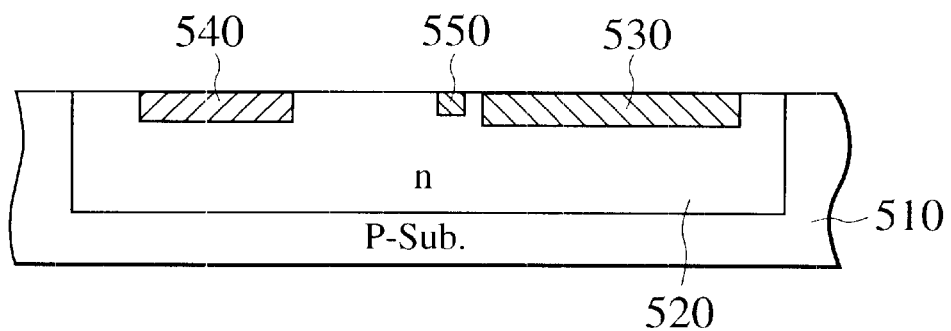
FIGS. 10A to 10C are sectional views showing semiconductor devices according to prior arts.
Figure 10B:
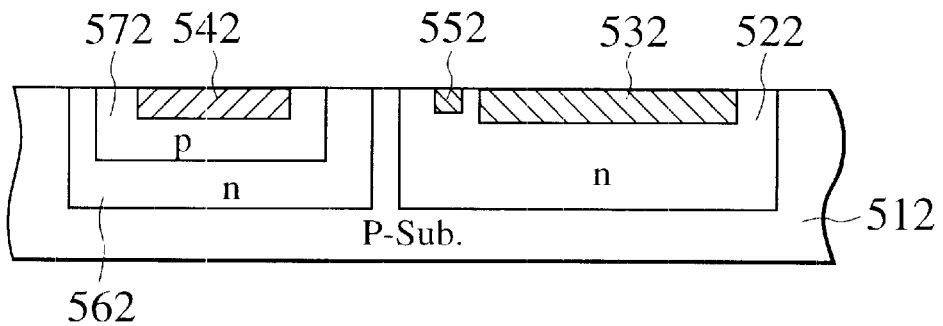
Figure 10C:
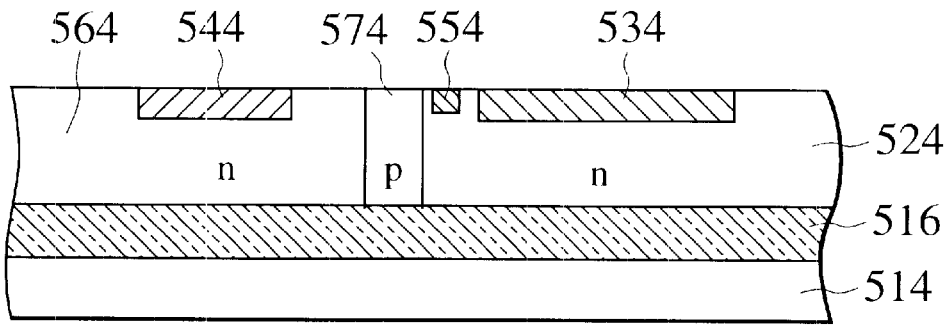
Figure 11A:
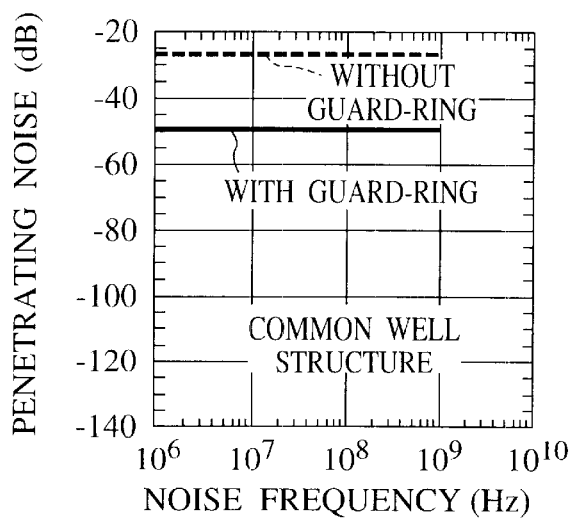
FIGS. 11A to 11C are graphs showing simulated noise penetration levels of the prior arts.
Figure 11B:
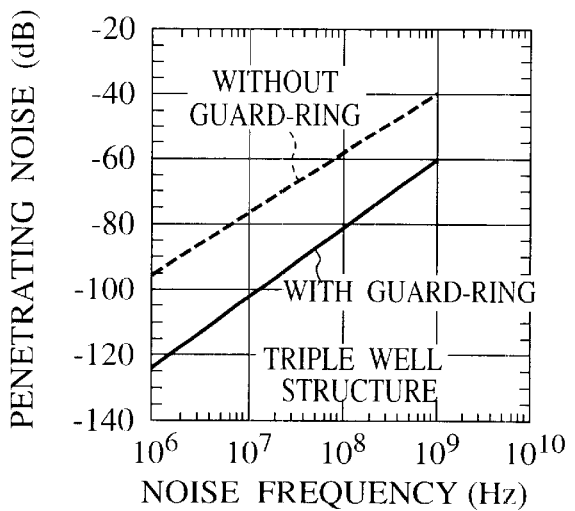
Figure 11C:
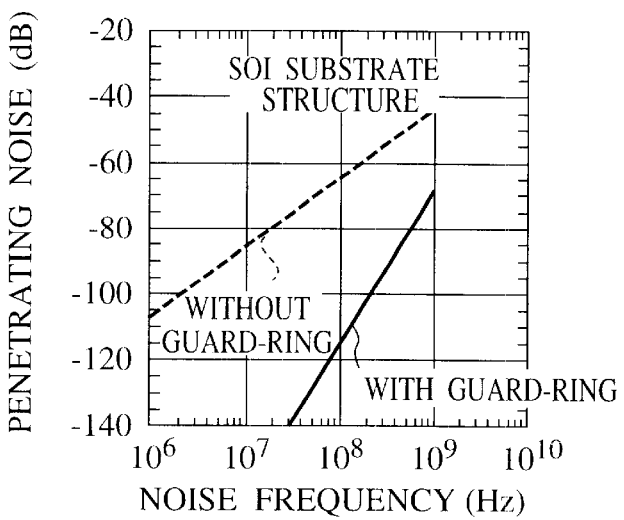

In FIG. 9D, n-wells 150 and 170 are formed to provide a digital circuit forming area and an analog circuit forming area. The n-wells 150 and 170 are spaced from each other by at least 0.5 $\mu$m. In the n-wells 150 and 170, p-wells 160 and 180 are formed. The oxide film in the guard-ring trench 121 is removed by etching. With a resist film 140 around the trench 121 being left or newly formed as an ion implantation mask, ions such as P ions are implanted in the bottom of the trench 121 at 40 keV. As a result, an ion implanted layer 210 is formed at the bottom of the trench 121 as shown in FIG. 9E. The ion implanted layer 210 is annealed separately or during a source/drain region forming process.

An inner surface of the trench 121 is covered with, for example, Co or W of about 15 nm thick by, for example, spattering. Annealing is carried out at 600°C. to 800°C. to form a silicide layer 220 on the inner surface of the trench 121 that is in contact with the silicon substrate. Metal that has not been changed to silicide is removed by wet etching. The silicide layer 220 is a low resistance region having a sheet resistance of about 8$\Omega$/□.

In this way, the guard-ring of the present invention is formed by first making the trench 121 and by implanting ions in the bottom of the trench 121. This technique secures a trench depth in advance, and therefore, easily makes a deep guard-ring. For example, a trench of 0.4 $\mu$m deep is provided with an ion implanted layer of 0.3$\mu$m, to provide a guard-ring of 0.7 $\mu$m in total depth.

The guard-ring structures and manufacturing methods mentioned above are applicable as they are to forming a deep guard-ring in an SOI substrate.

The first to third embodiments are not intended to limit the present invention. For example, elements formed in analog and digital circuits are not limited to CMOS transistors. They may be bipolar transistors or other elements. The p and n conductivity types of semiconductor regions of any one of the embodiments may be replaced with each other.

As mentioned above, the semiconductor device with analog and digital circuits according to the first aspect of the present invention employs a high-resistance semiconductor substrate to prevent noise penetration from a digital circuit to an analog circuit. This noise preventive effect is comparable to that of an SOI substrate semiconductor device. Namely, the present invention is capable of replacing an expensive SOI substrate with an inexpensive high-resistance substrate.

The semiconductor device of the first aspect of the present invention may have a deep guard-ring to prevent high-frequency noise from entering the analog circuit. The deep guard-ring of the present invention is applicable to an SOI substrate, to prevent high-frequency noise.

The method of the present invention for manufacturing a semiconductor device easily forms a deep guard-ring. Without increasing the number of processes, the present invention provides a semiconductor device with a function of preventing noise penetration from a digital circuit to an analog circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having digital and analog circuits, comprising:

a semiconductor substrate of a first conductivity type;

first and second wells of a second conductivity type independently formed at a surface of the semiconductor substrate;

the digital circuit formed at a surface of the first well; and the analog circuit formed at a surface of the second well, wherein:

the specific resistance of the semiconductor substrate is at least 1000 times as large as the specific resistance of the first well.

2. The semiconductor device according to claim 1, wherein:

the semiconductor substrate is prepared according to any one of MCZ, CZ, and FZ methods.

3. The semiconductor device according to claim 1, wherein:

the semiconductor substrate contains a solid solution oxygen quantity of $1 \times 10^{18}$ atoms/cm$^3$ or below.

4. The semiconductor device according to claim 1, wherein:

the first and second wells are separated from each other by 0.5 μm or longer.

5. The semiconductor device according to claim 1, further comprising a third well of the first conductivity type formed at the surface of the second well, wherein:

the analog circuit is formed in the third well.

6. The semiconductor device according to claim 1, further comprising a conductive guard-ring formed in a surface area that is between the digital circuit and the second well and inside the first well or between the first well and the second well.

7. The semiconductor device according to claim 6, wherein:

a distance between a bottom of the guard-ring and a bottom of the first well, which is along the vertical direction to the surface of the substrate, is 0.8 μm or shorter.

8. A semiconductor device having digital and analog circuits, comprising:

a substrate having an upper semiconductor layer, a lower semiconductor layer, and an insulating layer sandwiched between the upper and lower semiconductor layers;

first and second wells of a second conductivity type independently formed in the upper semiconductor layer with a semiconductor region of a first conductivity type being interposed therebetween;

the digital circuit formed at a surface of the first well;

the analog circuit formed at a surface of the second well; and a conductive guard-ring formed in a surface area that is between the digital circuit and the second well and inside the first well or between the first well and the second well, wherein:

a distance between a bottom of the guard-ring and a bottom of the first well, which is along the vertical direction to a surface of the substrate, is 0.8 μm or shorter.

9. The semiconductor device according to claim 6, wherein:

the guard-ring comprises a trench, an oxide layer covering an inner surface of the trench, and a metal layer filling the trench.

10. The semiconductor device according to claim 8, wherein:

the guard-ring comprises a trench, an oxide layer covering an inner surface of the trench, and a metal layer filling the trench.

11. The semiconductor device according to claim 6, wherein:

the guard-ring comprises a trench and an impurity ion doped region formed under a bottom of the trench.

12. The semiconductor device according to claim 8, wherein:

the guard-ring comprises a trench and an impurity ion doped region formed under a bottom of the trench.

13. The semiconductor device according to claim 11, wherein:

the guard-ring further comprises one of a metal layer and a metal silicide layer formed on an inner surface of the trench.

14. The semiconductor device according to claim 12, wherein:

the guard-ring further comprises one of a metal layer and a metal silicide layer formed on an inner surface of the trench.

\* \* \* \* \*